US008049504B2

(12) United States Patent
Findeklee (10) Patent No.: US 8,049,504 B2
(45) Date of Patent: Nov. 1, 2011

(54) SIMPLE DECOUPLING OF A MULTI-ELEMENT RF COIL, ENABLING ALSO DETUNING AND MATCHING FUNCTIONALITY

(75) Inventor: Christian Findeklee, Norderstedt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 239 days.

(21) Appl. No.: 12/297,663

(22) PCT Filed: Apr. 3, 2007

(86) PCT No.: PCT/US2007/065846

§ 371 (c)(1),
(2), (4) Date: Oct. 20, 2008

(87) PCT Pub. No.: WO2007/124247

PCT Pub. Date: Nov. 1, 2007

(65) Prior Publication Data

US 2009/0076377 A1    Mar. 19, 2009

Related U.S. Application Data

(60) Provisional application No. 60/745,459, filed on Apr. 24, 2006.

(51) Int. Cl.
*G01V 3/00* (2006.01)

(52) U.S. Cl. ........ 324/322; 324/318; 324/309; 324/307; 324/300

(58) Field of Classification Search .......... 324/318–322, 324/300–317, 328; 600/407–435; 333/219–335
See application file for complete search history.

(56) References Cited

U.S. PATENT DOCUMENTS

| | | | |
|---|---|---|---|
| 2,764,742 A * | 9/1956 | Cady et al. | 333/221 |
| 4,728,896 A | 3/1988 | Bendall et al. | |
| 4,801,885 A | 1/1989 | Meissner et al. | |
| 4,812,764 A | 3/1989 | Bendall | |
| 4,833,409 A | 5/1989 | Eash | |
| 4,947,121 A | 8/1990 | Hayes | |
| 5,260,658 A | 11/1993 | Greim et al. | |
| 6,150,816 A * | 11/2000 | Srinivasan | 324/318 |

(Continued)

FOREIGN PATENT DOCUMENTS

JP    2002306442 A    10/2002

OTHER PUBLICATIONS

Zhu et al. "Improving Flip Angle Uniformity with Parallel Excitation", Proc. Intl. Cos. Mag. Reson. Med. 13 (2005) p. 2752.

(Continued)

*Primary Examiner* — Melissa Koval
*Assistant Examiner* — Tiffany Fetzner (57) ABSTRACT

A coil (36) includes coil elements ($38_1, 38_2, \ldots, 38_n$). The coil (36) can transmit radio frequency excitation pulses into an examination region (14) and/or receive responsive radio frequency pulses from the examination region (14). A compensation network (42) includes decoupling segments (98), which each has a selected electrical length at least of a quarter wavelength ($\lambda/4$) and is electrically coupled to an associated coil element ($38_1, 38_2, \ldots, 38_n$) and a reactive network (100). The compensation network (42) at least compensates coupling between the coil elements ($38_1, 38_2, \ldots, 38_n$).

15 Claims, 6 Drawing Sheets

U.S. PATENT DOCUMENTS

| | | | |
|---|---|---|---|
| 6,608,480 B1* | 8/2003 | Weyers | 324/318 |
| 6,900,636 B2 | 5/2005 | Leussler | |
| 6,904,307 B2* | 6/2005 | Karmarkar et al. | 600/423 |
| 7,088,104 B2* | 8/2006 | Bottomley | 324/322 |
| 7,133,714 B2* | 11/2006 | Karmarkar et al. | 600/423 |
| 7,268,550 B2* | 9/2007 | Greim | 324/322 |
| 7,560,931 B2* | 7/2009 | Nabetani | 324/322 |
| 7,747,310 B2* | 6/2010 | Misic et al. | 600/423 |
| 7,800,368 B2* | 9/2010 | Vaughan et al. | 324/322 |
| 7,885,704 B2* | 2/2011 | Misic | 600/423 |
| 2002/0169374 A1 | 11/2002 | Jevtic | |
| 2003/0210049 A1 | 11/2003 | Boskamp et al. | |
| 2004/0046557 A1* | 3/2004 | Karmarkar et al. | 324/322 |
| 2004/0155656 A1* | 8/2004 | Leussler | 324/318 |
| 2004/0236209 A1* | 11/2004 | Misic et al. | 600/423 |
| 2004/0257073 A1* | 12/2004 | Greim | 324/300 |
| 2005/0062472 A1* | 3/2005 | Bottomley | 324/317 |
| 2005/0275403 A1 | 12/2005 | Pinkerton et al. | |
| 2006/0119361 A1* | 6/2006 | Karmarkar et al. | 324/322 |
| 2006/0238198 A1* | 10/2006 | Nabetani | 324/318 |
| 2008/0129298 A1* | 6/2008 | Vaughan et al. | 324/322 |
| 2009/0076377 A1* | 3/2009 | Findekelee | 600/422 |
| 2009/0076378 A1* | 3/2009 | Misic | 600/423 |

OTHER PUBLICATIONS

Kurpad, et al., "A Parallel Transmit Volume Coil with Independent Control of Currents on the Array Elements", Proc. Intl. Soc. Mag. Reson. Med. 13 (2005) p. 16.

King, et al., "A 4T Four Channel Transceive Spin Array", Proc. Intl. Soc. Mag. Reson. Med. 13 (2005) p. 329.

Adriany, et al., "A Geometrically Adjustable 16 Channel Transceive Transmission Line Array for 7 Tesla", Proc. Intl. Soc. Mag. Reson. Med. 13 (2005), p. 673.

Wichman, et al., "An Optimized Four Channel BIGMAC-Array for 7.05 T", Proc. Intl. Soc. Mag. Reson. Med. 13 (2005) p. 680.

Hoult, et al., "A 'Hi-Fi' Cartesian Feedback Spectrometer for Precise Quantitation and Superior Performance", Proc. Intl. Soc. Mag. Reson. Med. 13 (2005) p. 847.

Pang, et al., "Compensation for Mutual Coupling in Transmit SENSE", Proc. Intl. Soc. Mag. Reson. Med. 13 (2005), p. 887.

Nam, et al., "Transmit Surface Coil Array Using RF Current Sources", Proc. Intl. Soc. Mag. Reson. Med. 13 (2005), p. 917.

Lee, R. F., et al.; Coupling and Decoupling Theory and its Application to the MRI Phased Array; 2002; MRM; 48:203-213.

* cited by examiner

SIMPLE DECOUPLING OF A MULTI-ELEMENT RF COIL, ENABLING ALSO DETUNING AND MATCHING FUNCTIONALITY

CROSS REFERENCE TO RELATED APPLICATIONS

This application claims the benefit of U.S. provisional application Ser. No. 60/745,459 filed Apr. 24, 2006, which is incorporated herein by reference.

The present application relates to the magnetic resonance arts. It finds particular application in magnetic resonance imaging coils and scanners, and will be described with particular reference thereto. More generally, it finds application in magnetic resonance systems for imaging, spectroscopy, and so forth.

Magnetic resonance imaging (MRI) apparatus is commonly used for the examination of patients. In MRI, RF coils are used to generate $B_1$ fields within the imaging subject for exciting the nuclear spins and to detect signals from the nuclear spins.

In some multi-channel transmit/receive MRI systems, one of a plurality of transmitting units is assigned to each RF coil or coil segment and provided for independently adjusting the amplitude and/or the phase and/or the shape of the RF waveform to be transmitted; while one of a plurality of receiving units is assigned to each RF coil or coil segment. More specifically, independent amplitudes and/or the phases and/or the shapes of the RF waveforms to be transmitted are used to compensate for dielectric resonances in examination objects or to excite and optimize a desired excitation pattern or to shorten the transmit pulse length such as in Transmit SensE.

Locating several RF transmitters in close proximal alignment causes mutual coupling between the antenna or coil elements. The phases and amplitudes of the currents in coupled antenna elements become interrelated. Power is exchanged among the RF transmit channels.

One method to compensate for mutual coupling is to use passive decoupling networks. Passive decoupling methods are applicable in a useful manner for a limited number of coils since the determination of the capacitive and/or inductive elements becomes rather difficult for a large number of channels. In addition, a decoupling and matching network can only be determined and assembled for the expected standard load, which is not necessarily the actual load. At higher fields, small changes in load can have a significant effect on the decoupling of elements. Another problem in the passive decoupling networks includes the presence of parasitic capacitances and inductances of the connectors, which might cause undesired resonances.

The present application provides new and improved methods and apparatuses which overcome the above-referenced problems and others.

In accordance with one aspect, a coil system is disclosed. A coil includes coil elements. The coil at least one of transmits radio frequency excitation pulses into an examination region and receives responsive radio frequency pulses from the examination region. A compensation network includes decoupling segments, which each has a selected electrical length at least of a quarter wavelength (or an equivalent) and is electrically coupled to an associated coil element and a reactive network which includes capacitors and/or inductors. The compensation network at least compensates magnetic coupling between the coil elements.

In accordance with another aspect, a magnetic resonance system is disclosed. A main magnet generates a main magnetic field through an examination region. A plurality of RF transmitters generates RF resonance excitation pulses at a resonance frequency of selected dipoles in the examination region. A plurality of RF receivers receives and demodulates resonance signals from dipoles in the examination region. A plurality of RF coil elements is disposed adjacent the examination region. A plurality of effective quarter wavelength cables, each including an RF cable conductor, is connected between the coil elements and the reactive network. At least one of the transmitters and/or receivers can be connected to the coil via the cables.

One advantage is that each coil element is decoupled from the other coil elements individually.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
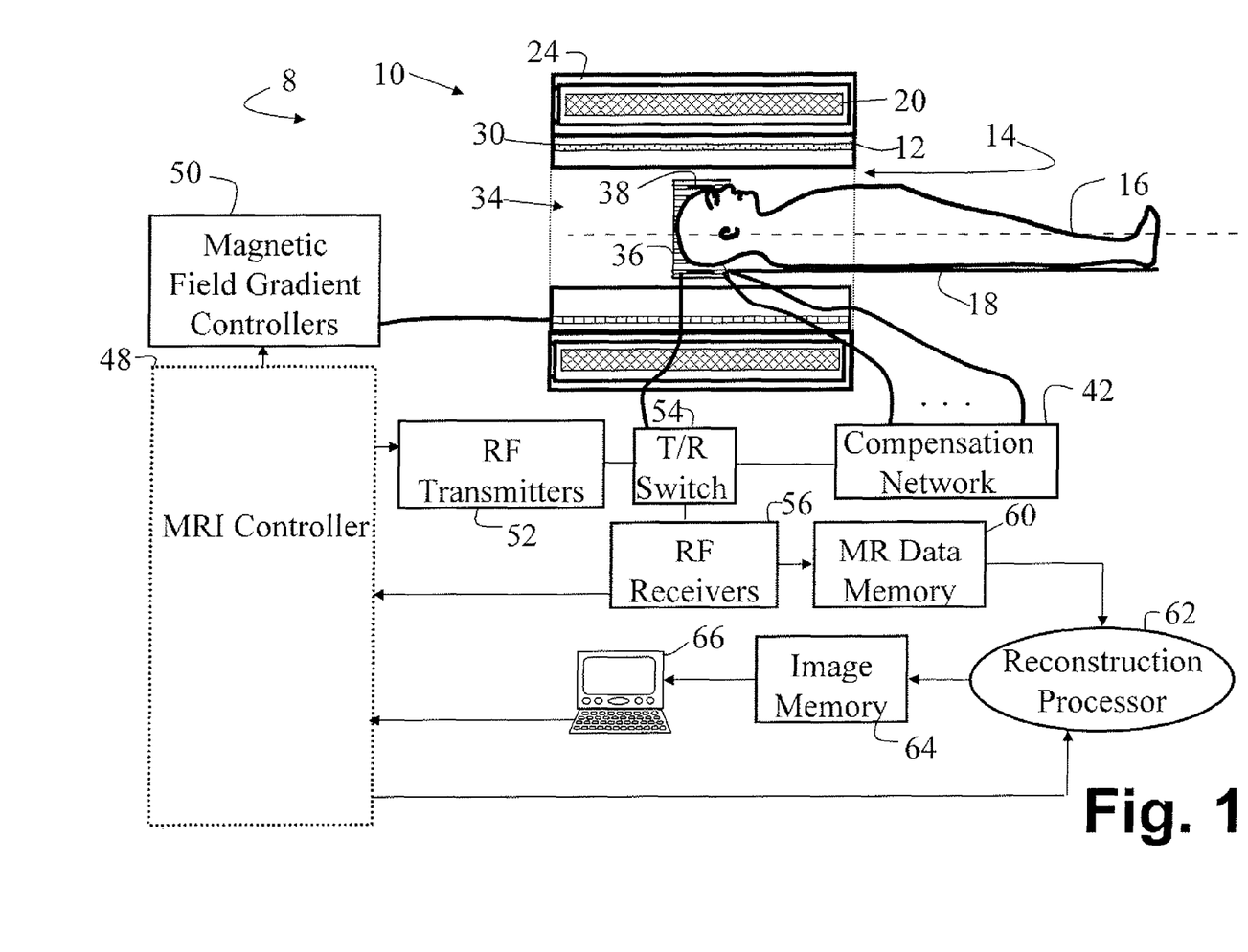
FIG. 1 is a diagrammatic illustration of a magnetic resonance imaging system.
Figure 2:
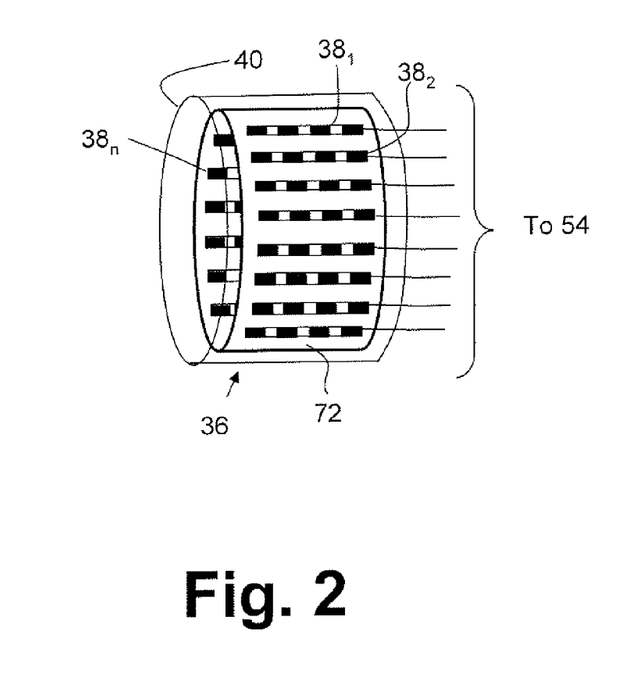
FIG. 2 is a diagrammatic illustration of a TEM coil.

With reference to FIGS. 1 and 2, a magnetic resonance imaging system 8 includes a scanner 10 including a housing 12 defining an examination region 14, in which is disposed a patient or other imaging subject 16 on a patient support or bed 18. A main magnet 20 disposed in the housing 12 generates a main magnetic field $B_0$ in the examination region 14. Typically, the main magnet 20 is a superconducting magnet surrounded by cryo shrouding 24; however, a resistive or permanent main magnet can also be used. Various $B_0$ magnetic fields are contemplated such as 3T at which protons has a resonance frequency of 128 MHz or 7T at which protons have a resonance frequency of 300 MHz. Magnetic field gradient coils 30 are arranged in or on the housing 12 to superimpose selected magnetic field gradients on the main magnetic field within the examination region 14. An RF coil system or arrangement 34 with a surrounding shield 40 is disposed about the examination region 14. The coil system 34 includes one or more RF coils 36 which each includes a plurality of radio frequency coil elements, segments, loops, or rungs 38 which each might have a different size and position. Although a local head coil is illustrated, it is to be appreciated that whole body coils, local surface coils and the like are also contemplated. The coil 36 may be a TEM coil, a birdcage resonator, an arrangement of loop resonators, or the like. In the exemplary embodiment, the coil 36 includes a plurality (n) of elements or segments $38_1, 38_2, \ldots, 38_n$ positioned around or in the intended volume of examination. The coil 36 is, for example, circularly cylindrical, but, of course, might have other geometries, such as an elliptic cross-section, semi-circular cross-section, semi-elliptical cross-section, and the like. As described in detail below, a compensation network 42 including cable assemblies, each of a selected electrical length, is coupled to the coil 36 and a reactive network to at least decouple the coil elements 38 from each other.

With continuing reference to FIG. 1, a magnetic resonance imaging controller 48 operates magnetic field gradient controllers 50 coupled to the gradient coils 30 to superimpose selected magnetic field gradients on the main magnetic field in the examination region 14, and also operates a plurality (e.g. n) radio frequency transmitters 52 each coupled by a transmit/receive switch 54 to an individual radio frequency coil element $38_1, 38_2, \ldots, 38_n$ or a subset of the segments to inject selected radio frequency excitation pulses at about the magnetic resonance frequency into the examination region 14 for imaging. The radio frequency transmitters 54 are individually controlled and can have different phases and amplitudes. The radio frequency excitation pulses excite magnetic resonance signals in the imaging subject 16 that are spatially encoded by the selected magnetic field gradients. Still further, the imaging controller 50 operates a plurality (e.g. n) radio frequency receivers 56 that each is individually controlled and connected with the individual coil element $38_1, 38_2, \ldots, 38_n$ of the coil system 34 by the transmit/receive switch 54 to demodulate the received and spatially encoded magnetic resonance signals. In the embodiments, where a transmit-only and/or a receive-only coil is used, the transmit/receive switch is omitted. Such coil is detuned in one of a receive or transmit phase. A coil that is used for both transmit and receive does not need to be switched off or detuned except for an application, where it remains inside the scanner while other coils are used. The received spatially encoded magnetic resonance data is stored in a magnetic resonance or MR data memory 60.

A reconstruction processor, algorithm, device, or other means 62 reconstructs the stored magnetic resonance data into a reconstructed image of the imaging subject 16 or a selected portion thereof lying within the examination region 14. The reconstruction processor 62 employs a Fourier transform reconstruction technique or other suitable reconstruction technique that comports with the spatial encoding used in the data acquisition. The reconstructed image is stored in an image memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 10 and for displaying or otherwise manipulating the reconstructed images.

The described magnetic resonance imaging system 8 is an illustrative example. In general, substantially any magnetic resonance imaging scanner can incorporate the disclosed radio frequency coils. For example, the scanner can be an open magnet scanner, a vertical bore scanner, a low-field scanner, a high-field scanner, or so forth. In the embodiment of FIG. 1, the coil 36 is used for both transmit and receive phases of the magnetic resonance sequence; however, in other embodiments separate transmit and receive coils may be provided, one or both of which may incorporate one or more of the radio frequency coil designs and design approaches disclosed herein.

With particular reference to FIG. 2, the example illustrated radio frequency body coil is a TEM coil 36 (not to scale) which includes a plurality of elements $38_1, 38_2, \ldots, 38_n$. The elements $38_1, 38_2, \ldots, 38_n$ in this embodiment are arranged in parallel to one another and the $B_0$ field and surrounding the examination region 14. In the illustrated coil 36, the elements $38_1, 38_2, \ldots, 38_n$ include printed circuit strips disposed on an electrically non-conducting generally cylindrical substrate 72. The RF shield 40 extends spherically around the coil 36 and may be a conductive layer on an opposite face of the printed substrate 72 or a separate structure. Each element is connected to the RF shield 40, for example, via a resonance capacitor.

Figure 3:
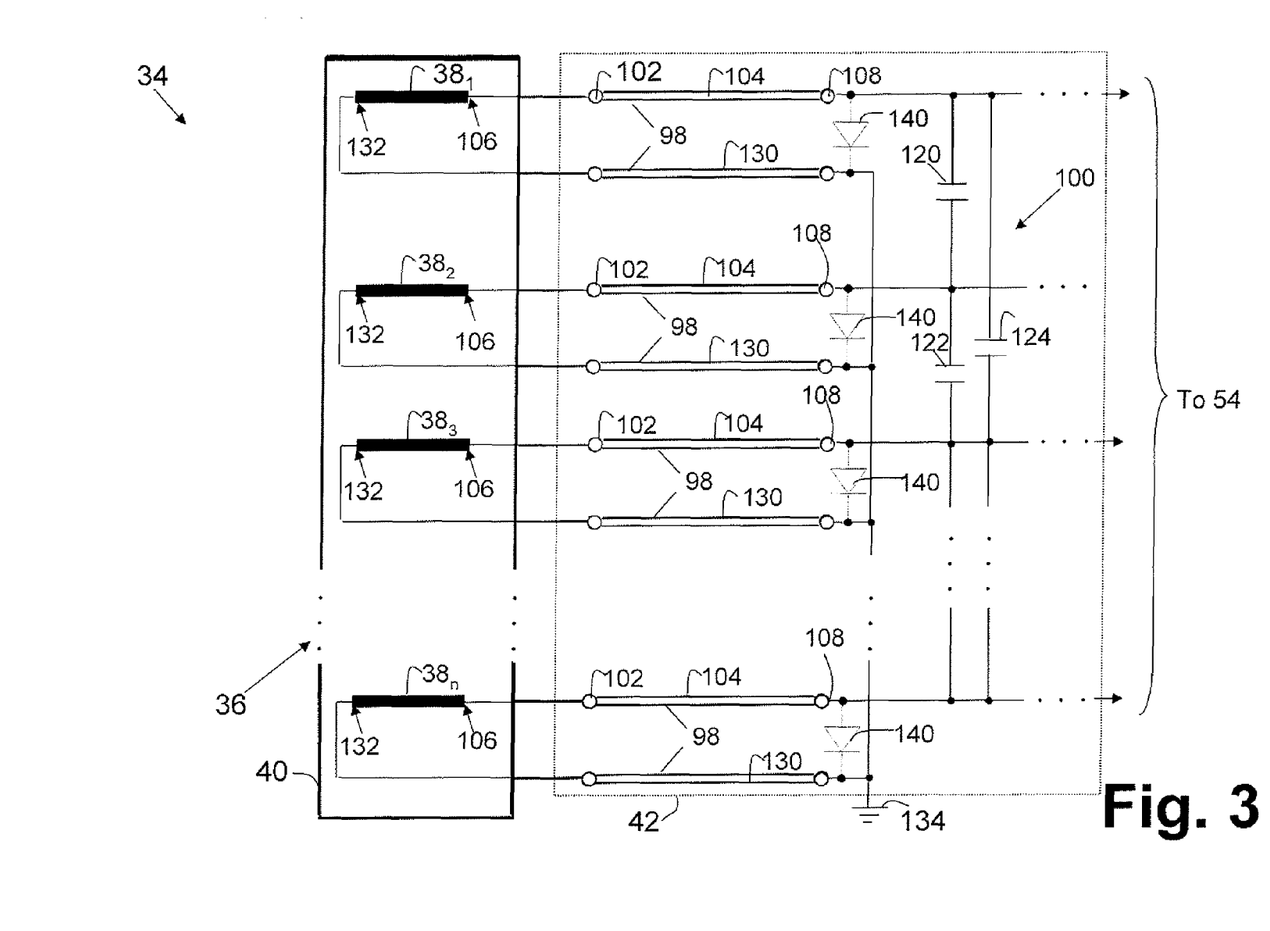
FIG. 3 is a diagrammatic illustration of a coil arrangement including a TEM coil and a compensation network.

With reference to FIG. 3, the compensation network 42 includes cables or cable assemblies 98 which each is characterized by a selected electrical length and electrically coupled to an associated element $38_1, 38_2, \ldots, 38_n$ and a reactive network 100. For example, each cable 98 is characterized by an electrical length of a quarter wavelength ($\lambda/4$) at the resonance frequency or an electrical length of a quarter wavelength ($\lambda/4$) with an addition of an integer times half wavelength ($\lambda/4+k\ \lambda/2$) at the resonance frequency. Other elements or circuits that are the electrical equivalent of a quarter wavelength cable ($\lambda/4$) or a quarter wavelength ($\lambda/4$) with an addition of an integer times half wavelength ($\lambda/4+k\ \lambda/2$) are contemplated. In a 7T scanner, for example, where protons have a resonance frequency of 300 MHz, a quarter wave line would have a length of $\lambda/4=25$ cm, if the line's relative dielectric constant is equal to unity. More specifically, a first connection point 102 of a line or RF conductor 104 is electrically coupled to a first connection point 106 of the associated element $38_1, 38_2, \ldots, 38_n$. A second connection point 108 of the line 104 is electrically coupled to the reactive network 100. The reactive network 100 includes a plurality of reactive elements, such as capacitors and/or inductors, values of which are determined such that at least each two elements $38_1, 38_2, \ldots, 38_n$ are decoupled from each other. In the example of FIG. 3, capacitors 120, 122 are coupled between corresponding pairs of nearest neighboring elements $38_1$ and $38_2$, $38_2$ and $38_3$ to decouple nearest neighbors. Capacitors 124 are coupled between next, nearest neighboring elements $38_1$ and $38_3$ to decouple next, nearest neighbors. Additional reactive elements can be provided to decouple from more remote elements. Of course, it is contemplated that the reactive network 100 can include a variety of compensating reactive elements coupled in a variety of configurations.

Each cable assembly 98 includes an associated cable shield or shield or shield conductor 130 connected to a second connection point 132 of each associated element $38_1, 38_2, \ldots, 38_n$ and the RF shield 40 which might be connected to a ground point 134 of the reactive network 100.

In one embodiment, a switching device 140 such as PIN diode is coupled between the second connection point 108 of the conductor 104 and ground point 134 for detuning the element $38_1, 38_2, \ldots, 38_n$ by grounding an associated cable 98. When a body coil is used for transmit and a local coil is used for receive, the switching devices 140 on the local coil are controlled to detune the local coil on transmit, e.g. the switching diodes are forward biased. Similarly, the switching devices 140 on the body coil can detune the body coil during receive. Optionally, additional tuning elements can be connected in parallel to the switching devices 140 to tune the coil elements.

Figure 4:
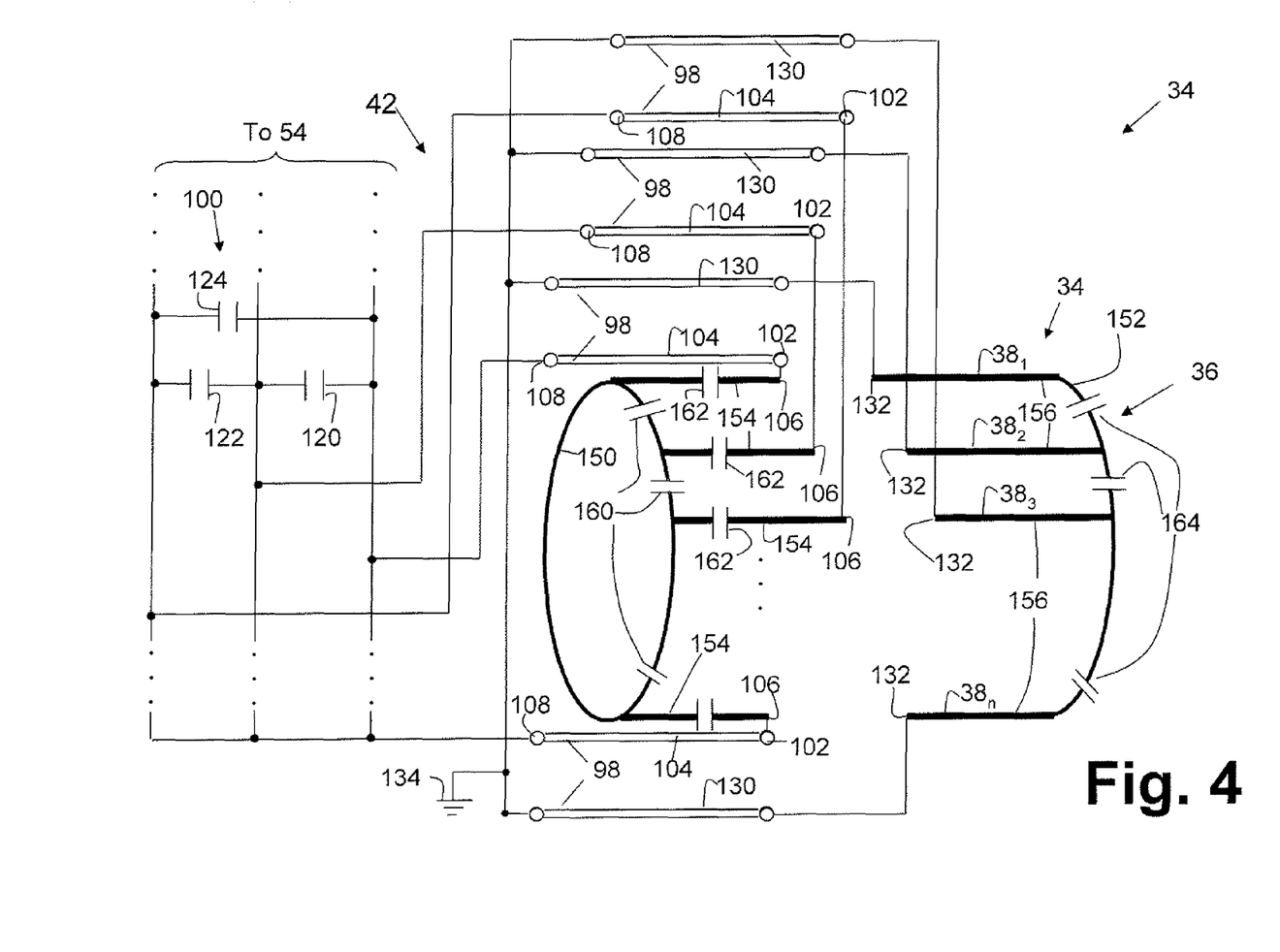
FIG. 4 is a diagrammatic illustration of a coil arrangement including a birdcage coil and a compensation network.

With reference to FIG. 4, in a birdcage embodiment, the radio frequency coil 36 includes a plurality of elements $38_1, 38_2, \ldots, 38_n$ in the form of rungs which are arranged in parallel to one another to surround the examination region 14. The elements $38_1, 38_2, \ldots, 38_n$ are connected to first and second end rings 150, 152 which provide a return current path. Each element $38_1, 38_2, \ldots, 38_n$ is split into first and second portions 154, 156 to expose the first and second connection points 106, 132 to be coupled to the associated cable assemblies 98. Similarly to the embodiment of FIG. 3, each cable assembly 98 is characterized by a selected electrical length. The first connection point 102 of each conductor 104 is electrically coupled to the first connection point 106 of the associated element $38_1, 38_2, \ldots, 38_n$. The second connection point 108 of the conductor 104 is electrically coupled to the reactive network 100. The reactive network 100 includes a plurality of reactive elements, such as capacitors and/or inductors, values of which are determined such that at least two elements $38_1, 38_2, \ldots, 38_n$ are decoupled from each other. In the example of FIG. 4, the capacitors 120, 122 are coupled between corresponding pairs of neighboring nearest elements $38_1$ and $38_2$, $38_2$ and $38_3$ to decouple nearest neighbors. In one embodiment, the nearest neighbors, e.g. the coil elements $38_1$ and $38_2$, $38_2$ and $38_3$, are decoupled from each other by selecting an appropriate ratio between capacitors in the first and second end rings 150, 152 and resonance capacitors in the elements $38_1, 38_2, \ldots, 38_n$, illustrated as lumped capacitors 160, 162, 164. The capacitor 124 is coupled between next, nearest neighboring elements $38_1$ and $38_3$ to decouple next, nearest neighbors. Of course, it is contemplated that the reactive network 100 can include a variety of compensating reactive elements coupled in a variety of configurations. The cable shields 130 are connected with the ground point 134 of the reactive network 100. Of course, it is contemplated that the cable shields 130 can be connected to different ground planes such as a coil ground point.

Figure 5:
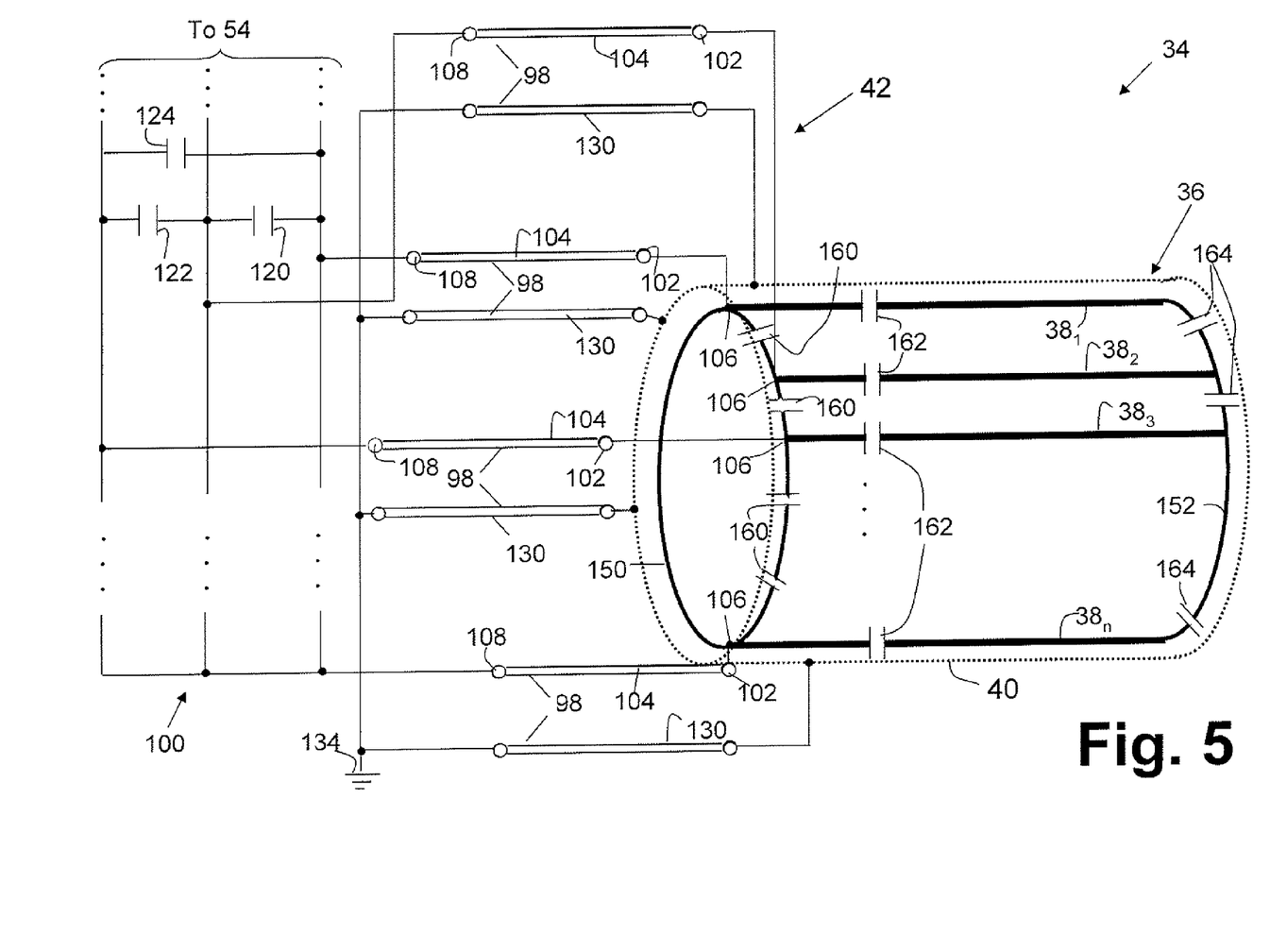
FIG. 5 is a diagrammatic illustration of another coil arrangement including a birdcage coil and a compensation network.

With reference to FIG. 5, the first connection point 102 of each conductor 104 is connected to the first connection point 106 of the associated element $38_1, 38_2, \ldots, 38_n$. In this embodiment, the first connection point 106 of the coil element is disposed at about a connection point between the element $38_1, 38_2, \ldots, 38_n$ and the first end ring 150. The second connection point 108 of the conductor 104 is electrically coupled to the reactive network 100. The shield 130 of each cable assembly 98 is connected between the RF screen 40 of the coil 36 and the ground point 134.

Figure 6:
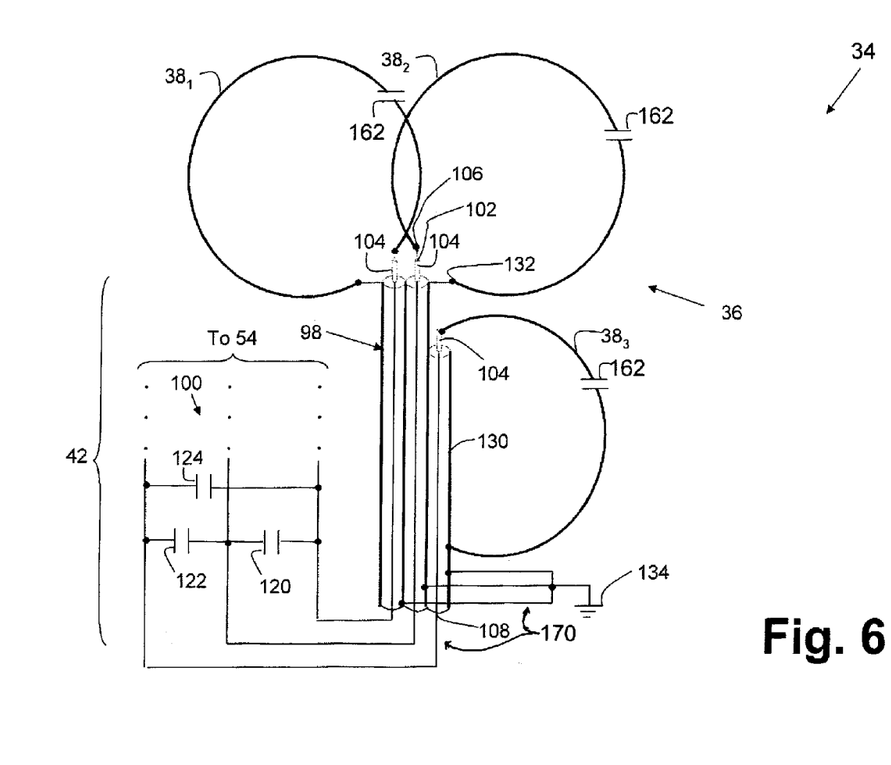
FIG. 6 is a diagrammatic illustration of a coil arrangement including loop resonators and a compensation network.

With reference to FIG. 6, in a surface coil embodiment, each element $38_1, 38_2, \ldots, 38_n$ is a loop. In one embodiment, the loop includes resonance capacitors illustrated as lumped capacitors 162. Each loop is opened to expose the first and second connection points 106, 132 to be coupled to the cable assembly 98. Similar to the embodiment of FIG. 3, the first connection point 102 of the conductor 104 is electrically coupled to the first connection point 106 of the associated loop $38_1, 38_2, \ldots, 38_n$. The second connection point 108 of the conductor 104 is electrically coupled to the reactive network 100. The reactive network 100 includes a plurality of reactive elements, such as capacitors and/or inductors, values of which are determined such that each loop $38_1, 38_2, \ldots, 38_n$ is decoupled from other loops. In the example of FIG. 6, the capacitors 120, 122 are coupled between corresponding pairs of nearest neighboring loops $38_1$ and $38_2$, $38_2$ and $38_3$ to decouple nearest neighbors. The capacitor 124 is coupled between next, nearest neighboring loops $38_1$ and $38_3$ to decouple next, nearest neighbors. Of course, it is contemplated that the reactive network 100 can include a variety of compensating reactive elements coupled in a variety of configurations.

In one embodiment, the cable assembly 98 is used to match the impedances of the coil elements to the impedance(s) of feeding or transmitting line(s) 170. This can be realized by choosing the appropriate line impedances for the cables 98. It is also contemplated that the feeding line 170 can be connected directly to the coil 36, optionally, via a matching network.

To explain the theory of the decoupling described above:

Generally, in a transmission line, which extends from $z=-\infty$ to $z=+\infty$, the voltage U (z) and current I (z) are z dependent, where z is the position. As used in this document, the underlined values are peak phasors, e.g. $I(t)=real($ $I^*exp(jwt))$. With an apostrophe describing the deviation in space z, the differential equations can be derived for the voltage $\underline{U}$ and current $\underline{I}$ (in z-direction):

$$\underline{U}' = -Z'\underline{I} \tag{1}$$

$$\underline{I}' = -Y'\underline{U} \tag{2}$$

where Z' is differential impedance of the transmission line:

$$Z' = R' + j\omega L'$$

and Y' is differential admittance of the transmission line:

$$Y' = G' + j\omega C'$$

The wave equations are derived as:

$$\underline{U}'' = Z'Y'\underline{U} \tag{3}$$

$$\underline{I}'' = Z'Y'\underline{I} \tag{4}$$

The general solutions for the voltage and current are:

$$\underline{U} = \underline{U}_1 e^{-\gamma z} + \underline{U}_2 e^{+\gamma z} \tag{5}$$

$$\underline{I} = 1/Z_0 (\underline{U}_1 e^{-\gamma z} - \underline{U}_2 e^{+\gamma z}) \tag{6}$$

where $Z_0$ is the wave impedance; and
$\gamma$ is the wave number of the transmission line.

The wave impedance $Z_0$ is a ratio of voltage and current for a traveling wave in one direction is:

$$Z_0 = \sqrt{(Z'/Y')} \tag{7}$$

where Z' is differential impedance of the transmission line, and
Y' is differential admittance of the transmission line.

The wave number of the transmission line is related to the speed and damping of the transmission and is:

$$\gamma = \sqrt{(Z'Y')} \tag{8}$$

where Z' is differential impedance of the transmission line, and
Y' is differential admittance of the transmission line.

Assuming that the transmission line extends from $-\infty$ the position z equal to 0 with the boundary condition $\underline{U}=Z\underline{I}$, given by the impedance Z, for the position z equal to 0, equations (5) and (6) can be written as:

$$r = \frac{\underline{U}_2}{\underline{U}_1} = -\frac{\underline{I}_2}{\underline{I}_1} = \frac{Z - Z_0}{Z + Z_0} \tag{9}$$

where $Z_0$ is the wave impedance; and
r is a reflection factor which provides the relation of the waves in the two directions, e.g. positive and negative z-directions, which is given by the impedance at the end of the transmission line and the wave impedance.

For high frequencies, it is more convenient to use wave amplitudes, which are related to the power. For example, for the transmission lines of the TEM coil, the wave amplitudes a, b of the waves in the positive and negative z-direction are determined as:

$$\underline{a}(z=0) := \underline{U}_1 / \sqrt{(2Z_0)} \tag{10}$$

$$\underline{b}(z=0) := \underline{U}_2 / \sqrt{(2Z_0)} \tag{11}$$

where z is the position,
$Z_0$ is the wave impedance which is assumed to be real,
a is the amplitude of the wave traveling in the positive z-direction at the position z=0,
b is the amplitude of the wave traveling in the negative z-direction at the position z=0, $U_1$ is the voltage of the wave traveling in the positive z-direction in the transmission line at the position z=0, and
$U_2$ is the voltage of the wave traveling in the negative z-direction in the transmission line at the position z=0.

As observed from equations (10) and (11), the reflection coefficient r defined in equation (9) is the ratio of b to a. For any position z, the first and second wave amplitudes a, b can be expressed as:

$$a(z) := 1/\sqrt{(8Z_0)}(U(z)+Z_0 I(z)) \quad (12)$$

$$b(z) := 1/\sqrt{(8Z_0)}(U(z)+Z_0 I(z)) \quad (13)$$

where z is the position,
$Z_0$ is the wave impedance,
a(z) is the amplitude of the first wave at the position z,
b(z) is the amplitude of the second wave at the position z,
U(z) is the transmission line voltage at the position (z), and
I(z) is the transmission line current at the position (z).

The first and second wave amplitudes a and b can also describe a linear N-port device. In this case, the first and second wave amplitudes a and b become vectors. The transmission line impedance for each port can be written in as a vector:

$\vec{Z}_0$,

The vectors of the first and second wave amplitudes for each port can be presented as:

$$\vec{a} = \frac{1}{\sqrt{8}} diag\, \vec{Z}_0^{-\frac{1}{2}}(\vec{U} + diag \vec{Z}_0 \vec{I}) \quad (14)$$

$$\vec{b} = \frac{1}{\sqrt{8}} diag \vec{Z}_0^{-\frac{1}{2}}(\vec{U} - diag \vec{Z}_0 \vec{I}) \quad (15)$$

where diag $Z_0^{-1/2}$ is a diagonal matrix of the inverse square roots of the wave impedances,
$\vec{a}$ is the vector of the first wave amplitudes, traveling into the device,
$\vec{b}$ is the vector of the first wave amplitudes, coming out of the device,
$\vec{U}$ is the vector of the voltages at the ports of the device,
$\vec{I}$ is the vector of the currents flowing into the device,
$\vec{Z}_0$ is the vector of the wave impedances, and
$diag \vec{Z}_0$ is the diagonal matrix build from the elements of $\vec{Z}_0$.

By solving equations (14) and (15), the values for voltage and current are:

$$\vec{U} = \sqrt{2}\, diag \vec{Z}_0^{\frac{1}{2}}(\vec{a} + \vec{b}) \quad (16)$$

$$\vec{I} = \sqrt{2}\, diag \vec{Z}_0^{-\frac{1}{2}}(\vec{a} - \vec{b}) \quad (17)$$

A linear device can be presented by an impedance matrix, admittance matrix or scattering matrix accordingly expressed in equations (18), (19) and (20):

$$\vec{U} = Z \vec{I} \quad (18)$$

$$\vec{I} = Y \vec{U} \quad (19)$$

$$\vec{b} = S \vec{a} \quad (20)$$

where Z is the impedance matrix of the linear device,
Y is the corresponding admittance matrix,
S is the corresponding scattering matrix.

The relationship between Z and Y is given by inversion. The scattering matrix S is derived from the equations (18)-(20) using equations (14)-(15) and (16)-(17):

$$Z = diag \vec{Z}_0^{\frac{1}{2}} (1+S)(1-S)^{-1} diag \vec{Z}_0^{1/2} \quad (21)$$

$$S = diag \vec{Z}_0^{-\frac{1}{2}} (Z - diag \vec{Z}_0)(Z + diag \vec{Z}_0)^{-1} diag \vec{Z}_0^{1/2} \quad (22)$$

Equation (22) is a generalized formulation of the reflection factor r of equation (9).

$$Y = diag \vec{Z}_0^{-\frac{1}{2}} (1-S)(1+S)^{-1} diag\, \vec{Z}_0^{-\frac{1}{2}} \quad (23)$$

$$S = diag \vec{Z}_0^{-\frac{1}{2}} (1 + diag \vec{Z}_0 Y)(1 - diag \vec{Z}_0 Y)^{-1} diag \vec{Z}_0^{\frac{1}{2}} \quad (24)$$

$$= diag \vec{Z}_0^{\frac{1}{2}} (diag \vec{Z}_0^{-1} + Y)(diag \vec{Z}_0^{-1} - Y)^{-1} diag \vec{Z}_0^{-\frac{1}{2}} \quad (25)$$

A quater wave line has the following scattering matrix $$\begin{bmatrix} 0 & -j \\ -j & 0 \end{bmatrix} \quad (26)$$

A system of N quarter wave lines from port 1, ..., N to port N+1, ..., 2N results in the scattering matrix $S_{\lambda/4}$:

$$S_{\lambda,4} = \begin{bmatrix} 0 & -j \\ -j & 0 \end{bmatrix} \quad (27)$$

where j denotes a diagonal matrix of $j=\sqrt{-1}$.

Connecting ports N+1, ..., 2N to a device which has a scattering matrix $S_d$ results in a scattering matrix (related to the not connected ports):

$$S = -S_d \quad (28)$$

If the device which has a scattering matrix $S_d$, and an admittance matrix $Y_d$ is transformed by such a set of quarter wave lines, the resulting impedance matrix is:

$$Z = diag \vec{Z}_0^{\frac{1}{2}} (1+S)(1-S)^{-1} diag \vec{Z}_0^{1/2} \quad (29)$$

$$= diag \vec{Z}_0^{\frac{1}{2}} (1 - S_d)(1 + S_d)^{-1} diag \vec{Z}_0^{1/2}$$

$$= diag \vec{Z}_0 diag\, \vec{Z}_0^{-\frac{1}{2}} (1 - S_d)(1 + S_d)^{-1} diag\, \vec{Z}_0^{-\frac{1}{2}} diag \vec{Z}_0$$

$$= diag \vec{Z}_0 Y_d\, diag \vec{Z}_0$$

For example, the coil includes N elements which resonate at the operating frequency $f = \omega/(2\pi)$. If each element is opened to generate a port, a N-port network can be generated. If a short is connected to port n and all the other ports are left open, then the element number n becomes resonant at the frequency f while other elements are not operating.

The diagonal elements of the impedance matrix $Z_{coil}$ of the coil are defined by:

$$Z_{coil\_n,n} = \frac{U_{coil,n}}{I_{coil,n}}\bigg|_{I_{coil,k}=0 \; \forall \; k \neq n} \quad (30)$$

where $Z_{coil\_n,n}$ is the loss resistance $R_n$ of the element n:

$$Z_{coil\_n,n} = R_n \quad (31)$$

The non diagonal elements of the impedance matrix $Z_{coil}$ of the coil are:

$$Z_{coil\_m,n} = \frac{U_{coil,m}}{I_{coil,n}}\bigg|_{I_{coil,k}=0 \; \forall \; k \neq n} \quad (32)$$

The non diagonal elements of the impedance matrix $Z_{coil}$ of the coil system are given by the mutual inductance:

$$Z_{coil\_m,n} = j\omega M_{m,n} \quad (33)$$

In the ideal case of completely decoupled coil elements, the impedance matrix has only diagonal elements unequal to zero. In fact, in the majority of cases, the non-diagonal elements of the impedance matrix include non-zero values that have to be compensated. A compensation network or device, which includes N-ports and has an impedance matrix $Z_{dec}$, is coupled in series to the coil $Z_{coil}$ at each port. A combined impedance matrix $Z_\Sigma$ for N ports of the coil system, which includes the coil and compensation network, can be defined for the resulting structure. In the coil system, the currents are the same in all parts, e.g. the current in the coil system is equal to the current in the coil and current in the compensation network:

$$\vec{I}_\Sigma = \vec{I}_{coil} = \vec{I}_{dec}, \text{ where}$$

$\vec{I}_\Sigma$ is the current vector in the coil system, $\vec{I}_{coil}$ is the current vector in the coil, and $\vec{I}_{dec}$ is the current vector in the compensation network.

Voltage in the coil system is equal to a sum of the voltages in the coil and compensation network:

$$\vec{U}_\Sigma = \vec{U}_{coil} + \vec{U}_{dec}, \text{ where}$$

$\vec{U}_\Sigma$ is the voltage vector in the coil system,

A combined impedance matrix $Z_\Sigma$ of the coil system is equal a sum of impedances in the coil and compensation network:

$$Z_\Sigma = Z_{coil} + Z_{dec} \quad (34)$$

$Z_\Sigma$ the impedance matrix of the coil system, $Z_{coil}$ the impedance matrix of the coil, and $Z_{dec}$ the impedance matrix of the compensation system.

The coil system has to be decoupled, e.g. only the imaginary parts of the diagonal elements in the coil impedance matrix $Z_\Sigma$ can be unequal to zeroes. In addition, since the combined system has to be resonant, the diagonal elements in the combined impedance matrix $Z_\Sigma$ have to be equal to the real numbers.

The non diagonal elements of the compensation network are tuned to:

$$Z_{dec\_m,n} = -j\omega M_{m,n} \quad (35)$$

If the diagonal elements of the compensation impedance matrix of the compensation network deviate from zero, this results in a resonance frequency shift of the elements. This can be retuned by resonance capacitors in each element.

To tune each element individually, the described above transmission lines with a length of $(z/2+¼)\lambda$, where $\lambda$ is the wave length inside the cable and z is an integer.

An impedance Z (or admittance Y) is transformed by such line to:

$$Z \to \frac{Z_0^2}{Z}, \text{ or } 1/Y \to Z_0^2 Y$$

This can be generalized for a set of quarter wave lines with different line impedances:

$$Z_{dec} = \text{diag}\vec{Z}_0 \tilde{Y}_{dec} \text{diag}\vec{Z}_0 \quad (36)$$

In this manner, by changing a set of symmetric elements $\tilde{Y}_{m,n}$ and $\tilde{Y}_{n,m}$ in $\tilde{Y}_d$ only the corresponding elements $Z_{dec,m,n}$ and $Z_{dec,n,m}$ in $Z_{dec}$ are changed. A symmetric (what means $\tilde{Y}_{dec} = \tilde{Y}_{dec}^T$) device is built where the non diagonal elements of the admittance matrix can be tuned individually. This is simply done by placing admittances $-\tilde{Y}_{ded,m,n}$ from port m to n. In most cases (coupled coil arrays), the mutual inductivities are positive what results in capacitive elements in the decoupling matrix. If the mutual inductivities (or equivalent coupling from different origins) become negative, than inductors are used. After decoupling, the coil elements have to become resonant again. This can be done by adding elements to ground in the Y-device or by retuning the elements by changing the resonance capacitors.

The transmission lines described above have additional advantages:

(1) The decoupling can be placed anywhere, no complicated links have to be build inside the coil.

(2) The coil elements can be switched off (detuned) easily and individually.

(3) The transmission lines can be used to match the coil to the impedance of the feeding system.

The detuning can be solved by simply adding switchable shorts at the individual ends of the transmission lines. The short near the decoupling elements is transformed into an open circuit inside the coil elements. This also works individually, e.g. each element can be switched off while others are still in use.

It is further more possible to match the coil with the decoupling system also by choosing the line impedances (individually) to as $Z_0 = \sqrt{(Z_{match} * R_{loss})}$. In this case, the coil can be fed directly at the decoupling circuit. Alternatively, matching can be done anywhere on the elements in a traditional way. A smaller impedance of the transmission lines can be advantageous and can be realized by connecting some lines in parallel. The different line impedances do not affect the possibility to decouple and detune individually.

Generally, the reactive elements 120, 122, 124 of the compensation network 42 can be realized in many ways as long as the non diagonal element of the corresponding Y-Matrix is chosen by the value that enables decoupling. In general, lumped capacitors or inductors will be the best choice.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A radio frequency (RF) coil system compatible with magnetic resonance (MR) imaging, the RF coil system comprising:
   a coil including a plurality of coil elements, wherein the coil is configured to perform at least one of transmitting radio frequency excitation pulses into an examination region and receiving responsive radio frequency pulses from the examination region; and
   a compensation network including:
      a reactive network comprising a plurality of reactive elements including at least one of capacitive elements and inductive elements, the reactive elements of the reactive network having capacitive or inductive values such that the compensation network decouples each coil element from other coil elements, and
      decoupling segments each having an effective quarter wavelength ($\lambda/4$) at a resonance frequency of the coil element, wherein each decoupling segment includes (i) an RF conductor which is electrically coupled at a first end to a first connection point of an associated coil element of the coil and which is electrically coupled at a second end to the reactive network and (ii) a shield conductor which is electrically coupled at one end to a second connection point of the associated coil element and to a ground point such that the reactive network is separated from the coil elements by the decoupling segments.

2. The RF coil system as set forth in claim 1, wherein the reactive network includes:
   at least reactive elements electrically coupled between neighboring coil elements in order to at least individually decouple the coil elements from one another.

3. The RF coil system as set forth in claim 2, wherein the reactive network further includes:
   reactive elements electrically coupled between pairs of non-neighboring coil elements in order to decouple the non-neighboring coil elements from each other.

4. The RF coil system as set forth in claim 1, wherein the reactive network includes:
   reactive elements electrically connected to the second connection point of each conductor in order to at least decouple pairs of coil elements.

5. The RF coil system as set forth in claim 1, wherein each coil element of the RF coil includes:
   a first and a second portion, which first portion is coupled to a first end ring and a conductor of an associated decoupling segment and which second portion is coupled to a second end ring and a shield conductor of the associated decoupling segment.

6. The RF coil system as set forth in claim 5, wherein each end ring includes:
   corresponding capacitors disposed between neighboring coil elements, and each coil element includes resonance capacitors, the capacitors cooperate with the reactive network in order to decouple the neighboring elements from one another.

7. The RF coil system as set forth in claim 1, wherein the coil includes at least one of a TEM coil, a birdcage coil, and a surface coil array as the coil.

8. The RF coil system as set forth in claim 1, wherein the plurality of coil elements comprise:
   a plurality of loop coil elements as the coil elements.

9. A magnetic resonance imaging system comprising:
   a main magnet configured for generating a substantially temporally constant main magnetic field in the examination region;
   magnetic field gradient coils configured to impose selected magnetic field gradients on the main magnetic field within the examination region; and
   the RF coil system as set forth in claim 1.

10. A magnetic resonance method comprising:
    generating a substantially temporally constant magnetic field in the examination region; and
    with the RF coil system as set forth in claim 1, conducting a magnetic resonance sequence including at least the step of applying RF pulses to the coil elements; and
    receiving magnetic resonance signals.

11. The method as set forth in claim 10, wherein the coil elements extend in a direction substantially parallel to the substantially temporally constant magnetic field and the method further includes:
    adjusting the reactive elements of the reactive network in order to decouple the coil elements from each other.

12. The method as set forth in claim 11, further including:
    selectively shorting the conductor and the shield conductor in order to detune an associated coil element during generation of radio frequency pulses.

13. A magnetic resonance system including:
    a main magnet which generates a main magnetic field through an examination region;
    a plurality of radio frequency (RF) transmitters which generates RF resonance excitation pulses at a resonance frequency of selected dipoles in the examination region;
    a plurality of RF receivers which receives and demodulates resonance signals from dipoles in the examination region;
    a plurality of RF coil elements connected with the RF transmitters and disposed adjacent the examination region;
    a plurality of effective quarter wavelength ($\lambda/4$) cables, which each cable includes (i) an RF cable conductor connected at one end to a first connection point of an associated one or the coil elements and (ii) a shield conductor connected at one end to a second connection point of the associated one of the coil elements and also to a ground point; and
    a reactive network electrically coupled to the second ends of the RF conductors of the effective $\lambda/4$ cables such that the reactive network is separated from the coil elements by the effective $\lambda/4$ cables, the reactive network comprising a plurality of reactive elements including at least one of capacitive elements and inductive elements, the reactive elements of the reactive network having capacitive or inductive values determined to decouple the coil element from each other.

14. The system as set forth in claim 13, wherein the effective $\lambda/4$ cables include coaxial cables in which the shield conductors surround the RF conductors as a shield.

15. The system as set forth in claim 13, wherein each coil element is driven independently via a transmitting line which is coupled to a corresponding effective $\lambda/4$ cable and one of the transmitters in order to selectively apply RF pulses to an examination region and one of the receivers in order to receive the responsive RF pulses, wherein the cables match at least one impedance of an associated coil element to the impedance of the transmitting line.

* * * * *